United States Patent [19]

Momma et al.

[11] Patent Number: 4,497,106
[45] Date of Patent: Feb. 5, 1985

[54] SEMICONDUCTOR DEVICE AND A METHOD OF MANUFACTURING THE SAME

[75] Inventors: Yoshinobu Momma, Sagamihara; Tsuneo Funatsu, Kawasaki; Atusi Sasaki, Aizuwakamatsu, all of Japan

[73] Assignee: Fujitsu Limited, Kawasaki, Japan

[21] Appl. No.: 315,903

[22] Filed: Oct. 28, 1981

[30] Foreign Application Priority Data

Oct. 29, 1980 [JP] Japan .................. 55-151557

[51] Int. Cl.[3] ............ H01L 29/78; H01L 21/225
[52] U.S. Cl. .................................. 29/571; 29/578; 29/576 E; 29/577 R; 148/1.5; 148/188; 357/43; 357/59
[58] Field of Search ........ 29/571, 578, 576 E, 29/577; 148/187, 188, 1.5; 357/43, 44, 42, 59

[56] References Cited

U.S. PATENT DOCUMENTS 4,120,707 10/1978 Beasom .................. 357/43 X
4,125,426 11/1978 Inayoshi et al. .......... 148/188 X
4,233,615 11/1980 Takemoto et al. ........ 357/43 X

FOREIGN PATENT DOCUMENTS

2011173A  Great Britain.
51-148380  Japan.

OTHER PUBLICATIONS

IBM Technical Disclosure Bulletin, "NPN N-Channel Bipolar FET Devices", Vol. 17, No. 10, March 1975, pps. 2935-2936.
Patent Abstracts of Japan, Vol. 5, No. 55, Apr. 16, 1981 (JP-A-56-007462).

Primary Examiner—Brian E. Hearn
Assistant Examiner—David A. Hey
Attorney, Agent, or Firm—Staas & Halsey

[57] ABSTRACT

A semiconductor device comprising at least one bipolar transistor and at least one MIS FET integrated in a single semiconductor substrate, has an electrode for each region of the bipolar transistor and the MIS FET. Each electrode has the same conductivity type as the corresponding region and is connected to ohmic contact with the surface of the corresponding region.

4 Claims, 14 Drawing Figures

SEMICONDUCTOR DEVICE AND A METHOD OF MANUFACTURING THE SAME

BACKGROUND OF THE INVENTION

This invention relates to a semiconductor device, and especially to a semiconductor device in which a bipolar transistor and a MIS FET are formed in an epitaxial growth layer on the same semiconductor substrate and to a method of manufacturing the above device.

Though an integrated circuit device which comprises a bipolar transistor capable of conducting a large current and a MIS FET having a high input impedance, has many advantages with regard to circuit design, the process of manufacturing it is very complicated, so that there are many difficulties in putting it into practical use.

For example, in a prior art integrated semiconductor circuit of the above-mentioned type, disclosed in Japanese Patent Laid-Open No. 51-148380, it is necessary to place it in a furnace for about thirty minutes at a high temperature of about 1100° C. to form a gate insulating film of a MIS FET. Since this process is carried out after the emitter diffusion of a bipolar transistor, the emitter diffusion is still progressing in this process, and consequently the current amplification factor $h_{FE}$ of the bipolar transistor is changed from a desired value. Therefore, there is a problem in that it is difficult to control the current amplification factor $h_{FE}$ of the bipolar transistor at a desired value.

Thus, there is proposed a method of manufacturing a semiconductor device in which after the formation of the gate insulating film, the formation of the emitter region is effected at a temperature (for example 1000° C.) lower than the formation temperature of the gate insulating film. However, in the above-mentioned method, there are problems in that when the gate insulating film is thin (for example, below 1000 Å) the impurity used for the emitter diffusion is diffused into the surface of the semiconductor substrate through the insulating film. In addition the thickness of the gate insulator film is changed and therefore it becomes difficult to control the threshold voltage $V_{TH}$ of the MIS FET at a desired value. Therefore, in order to put the above-mentioned method into practical use, it is necessary to improve it still more.

SUMMARY OF THE INVENTION

It is an object of the present invention to solve the above-mentioned problems in prior art semiconductor devices of which comprise a bipolar transistor and a MIS FET.

A further object of the present invention is to provide a semiconductor device and a method of manufacturing it which make it possible to independently control the current amplification factor $h_{FE}$ of the bipolar transistor and the threshold voltage $V_{TH}$ of the MIS FET at desired values.

In accordance with the present invention, there is provided a semiconductor device comprising at least one bipolar transistor and at least one MIS FET integrated in a single semiconductor substrate. In each region of the emitter, base and collector of the bipolar transistor and in each region of the source and drain of the MIS FET there is provided an electrode which comprises a polycrystal semiconductor layer and an electrode metal layer formed upon the polycrystal semiconductor layer. The polycrystal semiconductor layer in each region has the same conductivity type as the corresponding underlying region, thereby forming an ohmic contact between the electrode metal layer and the surface of the corresponding region.

In accordance with the present invention, there is also provided a method of manufacturing the above-mentioned semiconductor device, comprising process steps of: forming a base region of a bipolar transistor and source and drain regions of a MIS FET in a semiconductor substrate, forming a gate insulating film of the MIS FET on the semiconductor substrate, and then forming an emitter region of the bipolar transistor in the semiconductor substrate. The method also comprises the process steps of: after forming the gate insulating film on the surface of the substrate and providing at least a window for forming the emitter region of the bipolar transistor, forming a polycrystal semiconductor layer covering at least the emitter window of the bipolar transistor and the gate insulating film, introducing an impurity through the emitter window into the substrate to form the emitter region of the bipolar transistor.

DESCRIPTION OF THE PREFERRED EMBODIMENTS

Figure 1A:
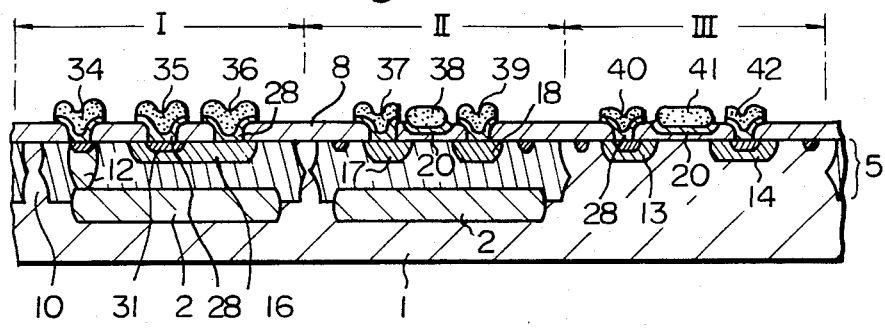
FIG. 1A illustrates the principal sectional view of a semiconductor device in accordance with an embodiment of the present invention.

The principal sectional view of a semiconductor device in accordance with an embodiment of the present invention is illustrated in FIG. 1A. In the semiconductor device of FIG. 1A, an n-type epitaxially grown layer 5 is formed upon the p-type silicon substrate 1, and in the epitaxial layer 5 an npn type bipolar transistor I, an n-channel MOS FET II, and a p-channel MOS FET III that is, a C MOS FETs are constructed.

The process steps of manufacturing the semiconductor device are illustrated in FIGS. 2A through 2K in sequence.

Figure 2A:
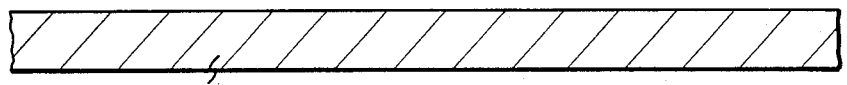
FIGS. 2A through 2K illustrate the sectional views of the semiconductor device of FIG. 1A in various process steps in the method of manufacturing the semiconductor device in accordance with the present invention.

At first, in FIG. 2A a p-type single crystal silicon substrate 1 oriented in the (100) plane with a resistivity of 10 to 20 Ω-cm is illustrated.

Figure 2B:
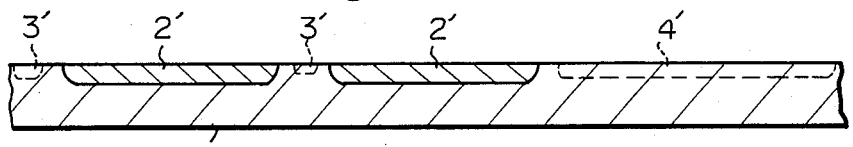

On the surface of the silicon substrate 1 of FIG. 2A, $n^+$-type islands 2' are formed by using an ordinary method of a selective diffusion, and then a $p^+$-type region 3' for forming an isolation region and a $p^+$-type island 4' for forming a p-well are formed as illustrated in FIG. 2B.

Figure 2C:
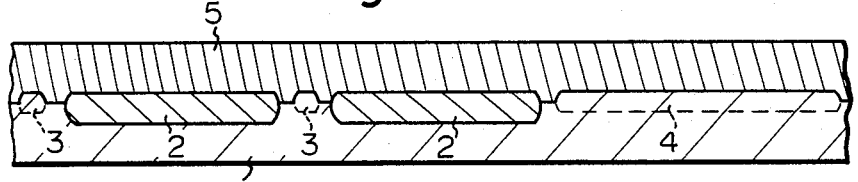

Upon the substrate 1 of FIG. 2B formed as described above, a p-type epitaxial layer 5 with a resistivity of 4 to 5 Ω-cm is grown up to about 10 μm in thickness. In the above-mentioned process step, the n-type and p-type regions 2', 3' and 4' are buried into the epitaxial layer 5 and form buried layers 2, 3 and 4 as illustrated in FIG. 2C.

Figure 2D:
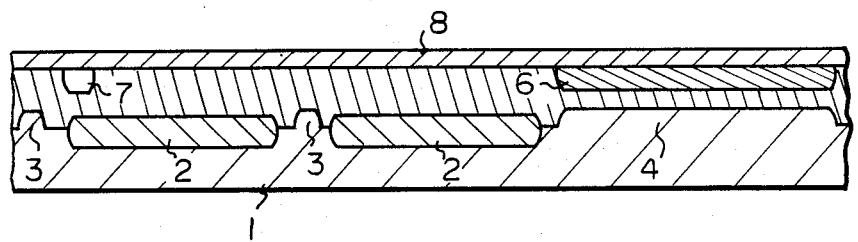

Then, by using a selective diffusion method or an ion implantation method, a p-type island 6 for the formation of a p-well and a $n^+$-type island 7 for the formation of a collector-leading region are formed on the surface of the epitaxial layer 5, and then by the thermal oxidation of the surface of the epitaxial layer 5, a silicon dioxide (SiO$_2$) film, that is, an insulating film 8, is formed as shown in FIG. 2D.

Figure 2E:
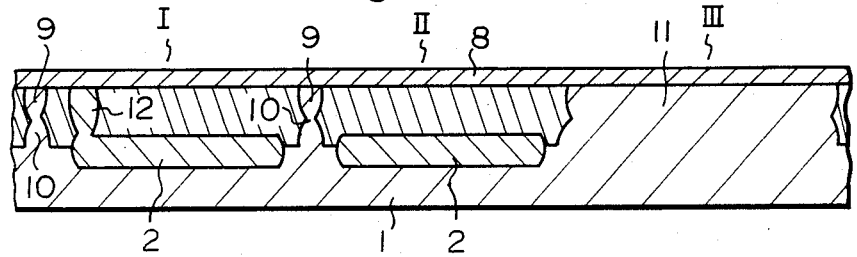

Then, after p-type islands are formed at the positions on the surface of the epitaxial layer 5 above the buried layers 3 and 4 by introducing the p-type impurity, a p-type isolation 9 and a p-well 11 are formed by carrying out a drive-in process. In like manner the n-type collector contact region 12 is formed as illustrated in FIG. 2E.

According to the above-mentioned process steps, all the regions for forming therein all the active elements of the device are settled. Thus, in FIG. 2E the region I surrounded by the isolation area 9 is the region for forming the npn type transistor, the region II divided by the isolation area 9 and the p-well 11 is the region for forming the p channel MOS FET, and the region III defined by the p-well 11 is the region for forming the n channel MOS FET.

Figure 2F:
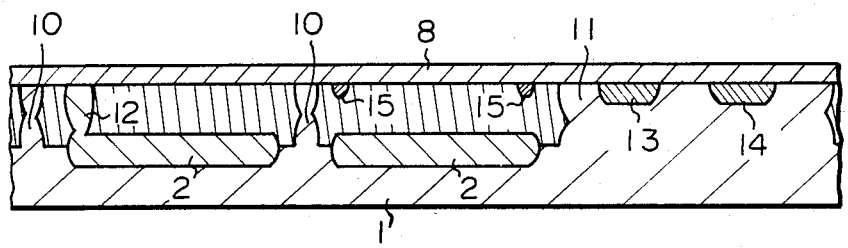
Figure 2G:
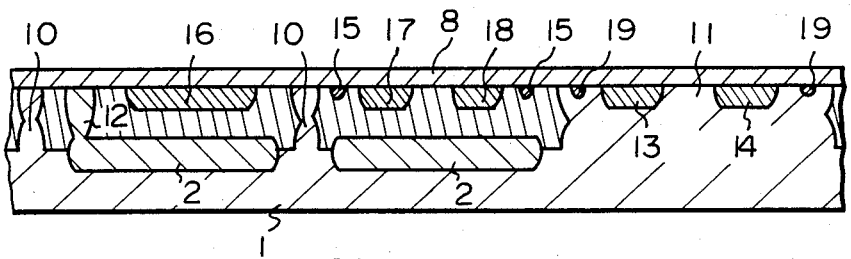

Then, introducing the n-type impurity by the selective diffusion method or the ion implantation method, the source and drain regions 13, 14 of the n channel MOS FET (n MOS) and the n-type channel stopper 15 of the p channel MOS FET (p MOS) are formed, as illustrated in FIG. 2F. By introducing a p-type impurity, the base region 16 of the npn type transistor, the source and drain regions 17, 18 of the p MOS, and the p-type channel stopper 19 of the n MOS are formed, as illustrated in FIG. 2G.

Figure 2H:
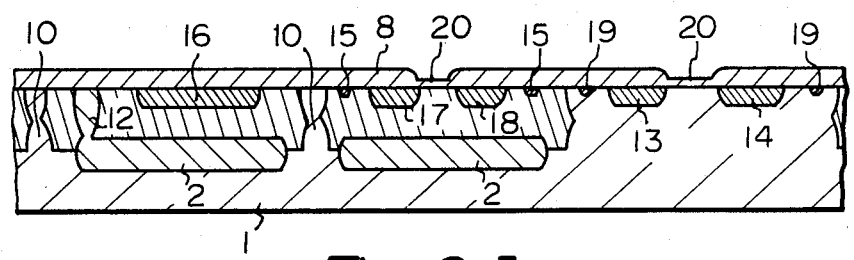

Then, the SiO$_2$ film 8 at the positions for forming the gate regions of the p MOS and the n MOS is removed, and after further heating and oxidizing the exposed surface of the epitaxial layer, the gate oxide films 20, 20', with about 1000 Å in thickness, are formed, as illustrated in FIG. 2H. In order to gain a good interface characteristic for the gate oxide films 20, 20', it is desirable that the above-mentioned process step be carried out by using the hydrochloric acid oxidation method in which the oxidation is effected in an atmosphere containing a hydrochloric acid (HCl) gas. After this process step, the substrate is annealed at a temperature of about 1100° C.

Figure 2I:
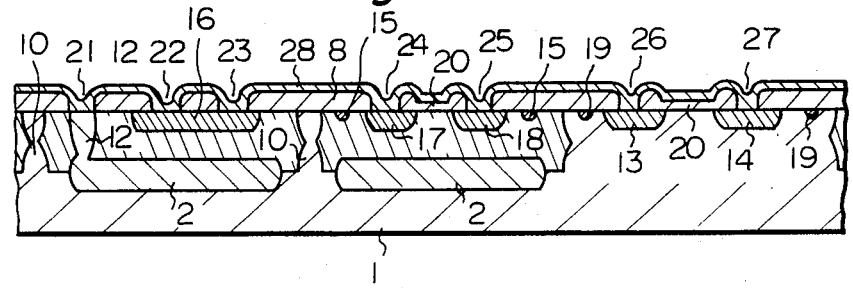

Then, by removing the SiO$_2$ film 8 selctively, a collector electrode window 21 is opened on the surface of the collector-leading region 12, an emitter electrode window 22 and a base electrode window 23 are opened on the surface of the base region 16, a source electrode window 24 and a drain electrode window 25 are opened respectively in the source and drain regions 17, 18 of the p MOS, and a source electrode window 26 and a drain electrode window 27 are opened respectively in the source and drain regions 13, 14 of the n MOS. Then, an undoped polycrystal silicon layer 28 is formed upon all the surface of the substrate including its portions on the above-mentioned electrode windows 21 through 27 as illustrated in FIG. 2I. The thickness of the polycrystal silicon layer 28 is usually made about 2000 Å. However this thickness may be made about 4000 Å (thicker than 2000 Å) in order to gain a so-called silicon gate characteristic, or it may be made 500 Å (thinner than 2000 Å) in order to gain a so-called aluminum gate characteristic.

Figure 2J:
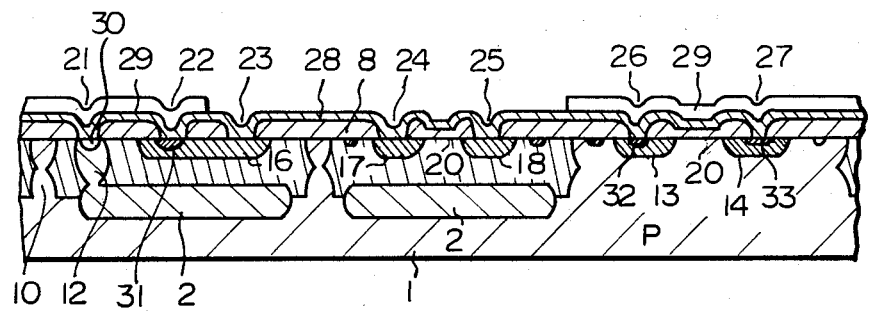

Then, after forming a phosphosilicate glass (PSG) layer 29 over the above-mentioned polycrystal silicon layer 28, the PSG film 29 is selectively removed at the positions of the base electrode window 23, and the source and drain electrode windows 24, 25 of the n MOS, to which positions the n-type impurity should not be introduced. The PSG film 29 selectively removed by using a conventional photolithography technique. Then, by executing a heating treatment, the n-type impurity phosphorus (P) is diffused from the remaining PSG film 29 through the polycrystal silicon layer 28 into the surface of the epitaxial layer at positions under the collector electrode window 21, the emitter electrode window 22, and the source and drain electrode windows 26, 27 of the n MOS. Accordingly a collector contact layer 30, an emitter region 31, a source contact layer 32 and a drain contact layer 33 of the n MOS, all of which are of a high impurity concentration n-type, are formed as illustrated in FIG. 2J. Then, the remaining areas of the PSG layer 29 are all removed by using an etching solution.

In the above-mentioned process step, the phosphorus (P) is introduced into the area of the polycrystal silicon layer 28 directly under the PSG film 29 so that this area becomes n-type, while into the areas of the polycrystal silicon layer 28 of the base electrode window 23, the source and drain electrode windows 24, 25 of the p MOS, which make contact directly with the p-type regions, the p-type impurity contained in these p-type regions is diffused so that these areas of the polycrystal silicon layer become p-type. Therefore, the areas of the polycrystal silicon layer 28 in contact with the respective regions through the respective electrode windows 21 through 27, have the same conductivity type as those of the corresponding underlying regions, and these areas are connected favorably by ohmic contact with their corresponding regions and can be used for the electrode contacts of these regions as they are.

In the above-mentioned process steps, all regions of the bipolar transistor and the C MOS and all the electrode contacts in accordance with the semiconductor device of FIG. 1A are formed.

Figure 2K:
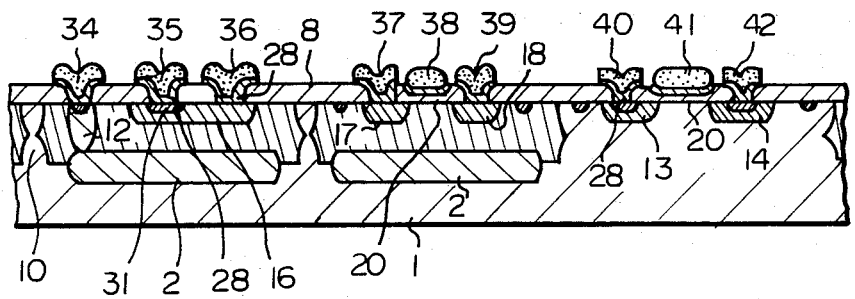

Then, an aluminum (Al) layer is formed to cover the polycrystal silicon layer 28, and the aluminum layer and the polycrystal silicon layer 28 under the aluminum layer are selectively removed to form a desired conductor wiring pattern, so that electrodes 34 though 42 composed of Al are formed, and finally the semiconductor device of FIG. 1A according to the present invention is obtained as illustrated in FIG. 2K.

In accordance with the above-mentioned method of manufacturing the semiconductor device according to the present invention, after the formation of the gate oxide film 20, the electrode windows of all the regions, except the gate region, are opened, the polycrystal silicon layer is coated; furthermore the PSG layer is coated over the electrode windows of the n-type regions, and by carrying out a so-called diffusion of impurity through the polysilicon method, in which the PSG layer is used as a source of impurity and the polycrystal silicon layer is used as a medium of impurity diffusion, the n-type impurity is diffused through only the desired electrode windows. In this case, in the other areas, the polycrystal silicon layer can be used as a protection film and therefore the thickness of the gate oxide film is kept unchanged during the above-mentioned diffusion of impurity through polysilicon. Furthermore, in the case of removing the PSG layer, the polycrystal silicon layer also serves as a protection film so that the thickness of the gate oxide film is kept unchanged. Accordingly, in the above-mentioned semiconductor device, the current amplification factor h$_{FE}$ of the bipolar transistor and the threshold voltages V$_{TH}$ of the p MOS and n MOS can be controlled independently. In addition, since the Al electrodes of all the regions are attached to the surface of the regions through the polycrystal silicon layer which are connected favorably in ohmic contact with the surface so that, so-called Al immersion which would otherwise be caused by an excessive alloying with the substrate silicon, is prevented. Therefore no pn junction near the surface is destroyed.

The method of manufacturing a semiconductor device according to the present invention is not limited by one embodiment described above, and may be executed in various modifications.

Figure 1B:
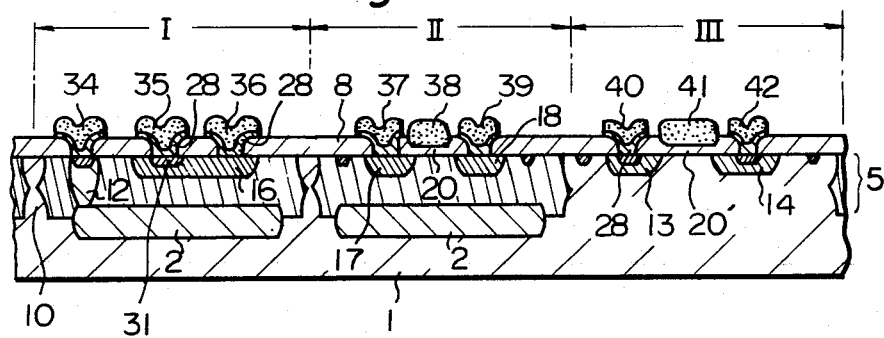
FIGS. 1B and 1C illustrate respectively the principal sectional views of semiconductor devices in accordance with other embodiments of the present invention.
Figure 1C:
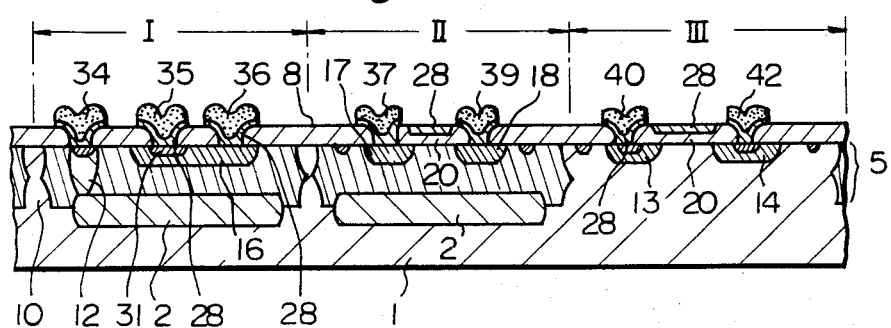

For example, in FIG. 2I the thickness of the polycrystal silicon layer 28 may be as thin as 500 Å, and over the gate insulating film the polycrystal silicon layer 28 may be reacted with the Al layer upon the layer 28 so that an Al gate MOS characteristics may be obtained. In this case, the semiconductor device obtained finally is that illustrated in FIG. 1B. Conversely, the thickness of the polycrystal silicon layer may be as thick as 4000 Å, and finally the Al layer on the polycrystal silicon layer may be removed to form a silicon gate. In this case, a semiconductor device as illustrated in FIG. 1C is obtained.

Besides, as a method of diffusing impurity through polysilicon, instead of the above-mentioned method of the described embodiment in which the PSG layer is used as an impurity source, one of the following methods may be used.

In one of these methods, instead of forming the PSG layer 29, a photo resist film which covers all the area of the surface except the portion on which the PSG layer 29 has been coated, is formed (refer to FIG. 2J). The photo resist film is used as a mask and an n-type impurity such as phosphorus (P) is implanted into the exposed polycrystal silicon layer and into the epitaxial layer under it by the ion implantation method. Then the photo resist film is removed and the substrate is annealed.

In another method of manufacturing the semiconductor device according to the present invention a SiO$_2$ film is formed instead of the photo resist film of the above-mentioned method and the n-type impurity is introduced by the selective diffusion method using the SiO$_2$ film as a mask.

In addition, it is apparent that the method of manufacturing a semiconductor device according to the present invention can be applicable to any combination of a bipolar transistor and a MIS FET other than that of a npn transistor and a C MOS, as illustrated in FIG. 1A, for example that of a pnp transistor and a C MOS.

As described above, according to the present invention, in the semiconductor device having a bipolar transistor and a MIS FET formed on the same substrate the emitter region of the bipolar transistor and the gate insulating film can be formed as desired by a simple manufacturing process without their having a mutual bad influence on each other. Therefore, there can be provided a semiconductor device in which the current amplification factor $h_{FE}$ of the bipolar transistor and the threshold voltage $V_{TH}$ of the MIS FET can be controlled independently, and also there is provided a method of manufacturing it.

We claim:

1. A method of manufacturing a semiconductor device having at least one bipolar transistor and at least one MIS FET integrated in a single semiconductor substrate, comprising the steps of:
    (a) forming a base region of the bipolar transistor and source and drain regions of the MIS FET in the semiconductor substrate, the base region having a first conductivity type, the source and drain regions having a second conductivity type which is the opposite of the first conductivity type;
    (b) forming a gate insulating film of the MIS FET on the semiconductor substrate;
    (c) forming a window for forming an emitter region of the bipolar transistor;
    (d) forming a polycrystal semiconductor layer covering at least the emitter window of the bipolar transistor and the gate insulating film; and
    (e) introducing an impurity through the emitter window into the semiconductor substrate to form the emitter region of the bipolar transistor in the semiconductor substrate.

2. A method as set forth in claim 1, wherein said step (e) comprises forming a phosphosilicate glass layer on at least the portion of the polycrystal semiconductor layer covering the emitter window, and heating the semiconductor device.

3. A method as set forth in claim 1 or 2, further comprising the step of (f) forming aluminum contacts on the polycrystal semiconductor layer and reacting the aluminum contacts and the polycrystal semiconductor layer at the portions overlying the gate insulating film.

4. A method as set forth in claim 1 or 2, further comprising the step of (f) forming aluminum contacts on the polycrystal semiconductor layer except for the portions over lying said gate insulating film.

* * * * *